US012589990B2

(12) United States Patent
Saklang et al.

(10) Patent No.: US 12,589,990 B2
(45) Date of Patent: Mar. 31, 2026

(54) DIE STACKING WITH CONTROLLED TILT AND ANGULAR ALIGNMENT

(71) Applicant: STMicroelectronics International N.V., Geneva (CH)

(72) Inventors: Chayathorn Saklang, Mesa, AZ (US); Stephen Ryan Hooper, Queen Creek, AZ (US); Dwight Lee Daniels, Phoenix, AZ (US); Scott M Hayes, Chandler, AZ (US); Jin Yang, North Plains, OR (US)

(73) Assignee: STMicroelectronics International N.V., Geneva (CH)

( * ) Notice: Subject to any disclaimer, the term of this patent is extended or adjusted under 35 U.S.C. 154(b) by 245 days.

(21) Appl. No.: 18/337,954

(22) Filed: Jun. 20, 2023

(65) Prior Publication Data

US 2024/0425364 A1 Dec. 26, 2024

(51) Int. Cl.
*B81C 1/00* (2006.01)
*B81B 7/00* (2006.01)

(52) U.S. Cl.
CPC ........ B81C 1/00269 (2013.01); B81B 7/0074 (2013.01); *B81B 2207/99* (2013.01); *B81C 2203/032* (2013.01); *B81C 2203/054* (2013.01)

(58) Field of Classification Search
CPC ... B81C 1/0023; B81C 1/00269; B81C 3/001; B81B 7/0032; B81B 7/02; B81B 7/0074
See application file for complete search history.

(56) References Cited

U.S. PATENT DOCUMENTS

| | | | |
|---|---|---|---|
| 6,627,096 B2 | 9/2003 | Sherrer et al. | |
| 6,973,225 B2 | 12/2005 | Nguyen et al. | |
| 7,332,820 B2 | 2/2008 | Tan et al. | |
| 2014/0247565 A1* | 9/2014 | Kobayashi | B81C 1/0023 |
| | | | 361/728 |
| 2015/0191349 A1 | 7/2015 | Wu et al. | |
| 2019/0062153 A1* | 2/2019 | Tseng | B81C 1/00531 |
| 2019/0074263 A1 | 3/2019 | Costa et al. | |
| 2020/0343213 A1* | 10/2020 | Takizawa | H01L 24/32 |
| 2023/0174370 A1* | 6/2023 | Sun | G02B 26/0858 |
| | | | 359/221.3 |

OTHER PUBLICATIONS

U.S. Appl. No. 18/337,954; 31 pages, filed Jun. 20, 2023.
Notice of Allowance for U.S. Appl. No. 18/337,588, mailed Sep. 9, 2025, 15 pages.
U.S. Appl. No. 18/337,588; 27 pages, Filed Jun. 20, 2023.
Notice of Allowance for U.S. Appl. No. 18/337,588, mailed Dec. 16, 2025, 14 pages.

* cited by examiner

*Primary Examiner* — Moazzam Hossain
(74) *Attorney, Agent, or Firm* — Seed Intellectual Property Law Group LLP

(57) ABSTRACT

Alignment features formed on a cover substrate allow for a second substrate to be bonded to the cover substrate while ensuring that the second substrate is not titled with respect to a plane defined by the alignment features. Die attachment material is patterned such that it deforms or flows underneath the second substrate while allowing corners of the second substrate to rest on landing areas that are elevated above the top surface of the cover substrate. Some of the landing areas may include additional features that are elevated above the landing areas to form notches which constrain the rotational position of the second in addition to its tilt.

20 Claims, 7 Drawing Sheets

100

150

130

110

102

104

DIE STACKING WITH CONTROLLED TILT AND ANGULAR ALIGNMENT

TECHNICAL FIELD

Embodiments of the subject matter described herein relate to electronic device packaging and multi-chip integration.

BACKGROUND

Semiconductor devices and other electronic devices are frequently assembled into packages to protect the devices from damage and to provide macroscopic electrical contacts. Packages can be made of various materials including polymers and ceramics. It can be desirable to assemble multiple devices within one package in order to reduce the volume required for various components in larger assemblies. It can also be desirable to interconnect multiple devices within a multi-chip package to save space and/or to improve device performance characteristics such as maximum clock speeds, power dissipation, and the like. In applications such as motion sensing, it can be desirable to assemble multiple sensing elements in a single package. In some such applications it is desirable to control the relative orientation of the devices in a multidevice package. For example, when single-axis sensors are packaged together as a multiple-axis sensor, it is desirable that the relative orientations are controlled.

SUMMARY

In an example embodiment, a method includes a cover being disposed above a first substrate and coupled to the first substrate. An alignment recess is formed in a top surface of the cover, where the alignment recess has a first length and a first width at a center of the alignment recess; and where the alignment recess has a second length that is less than the first length and a second width that is less than the first width at each of four corner regions of the alignment recess. A second substrate is disposed on the top surface of the cover above the alignment recess. The second substrate has a third length that is greater than the second length and a third width that is greater than the second length. Die attachment material is caused to fill part of the alignment recess such that corners of the second substrate rest on a surface of the cover surrounding the alignment recess and the second substrate is bonded to the cover by the die attachment material within the alignment recess. In one or more embodiments, the first substrate belongs to a first MEMS component that includes a mass suspended above the first substrate.

In an example embodiment, a device includes a cover disposed above a first substrate and coupled the cover to the first substrate. The device also includes an alignment recess formed in a top surface of the cover, where the alignment recess has a first length and a first width at a center of the alignment recess. The alignment recess has a second length that is less than the first length and a second width that is less than the first width at each of four corner regions of the alignment recess. A second substrate is disposed on the top surface of the cover above the alignment recess. The second substrate has a third length that is greater than the second length and a third width that is greater than the second length. Die attachment material fills part of the alignment recess such that corners of the second substrate rest on a surface of the cover surrounding the alignment recess. The second substrate is bonded to the cover by the die attachment material within the alignment recess. In one or more embodiments, the first substrate belongs to a first MEMS component that includes a mass suspended above the first substrate.

In another example embodiment, a method includes a cover disposed above a first substrate and coupling the cover to the first substrate; An alignment region is formed on the top surface of the cover. The alignment region includes landing surfaces at four corners of the alignment region that extend to a first height above the top surface of the cover within the alignment region. The alignment region also includes a first raised notch partially surrounding a first landing surface at a first corner of the alignment region and extending above the first landing surface; and a second raised notch partially surrounding a second landing surface at a second corner of the alignment region that is diagonally opposite the first corner and extending above the second landing surface. A second substrate is disposed within the alignment region such that corners of the second substrate rest on corresponding landing areas in the alignment region with a first corner of the second substrate resting within the first raised notch and a second corner of the second substrate resting within the second raised notch. Positions of the first notch and the second notch define a first axis parallel to the top surface of the cover and positions of the first corner and the second corner of the second substrate define a second axis parallel to the top surface of the cover. Elevations of the landing areas define a first plane and the second substrate is disposed within a second plane. The first axis and the second axis are angularly aligned to within less than two degrees of rotation. The second plane that is parallel to the first plane to within less than two degrees of tilt. In one or more embodiments, the first substrate belongs to a first MEMS component that includes a mass suspended above the first substrate.

In another example embodiment, a device includes a cover disposed above a first substrate and coupled the cover to the first substrate. An alignment region is formed on the top surface of the cover. The alignment region includes landing surfaces at four corners of the alignment region that extend to a first height above the top surface of the cover within the alignment region. The alignment region also includes a first raised notch partially surrounding a first landing surface at a first corner of the alignment region and extending above the first landing surface; and a second raised notch partially surrounding a second landing surface at a second corner of the alignment region that is diagonally opposite the first corner and extending above the second landing surface. A second substrate is disposed within the alignment region such that corners of the second substrate rest on corresponding landing areas in the alignment region with a first corner of the second substrate resting within the first raised notch and a second corner of the second substrate resting within the second raised notch. Positions of the first notch and the second notch define a first axis parallel to the top surface of the cover and positions of the first corner and the second corner of the second substrate define a second axis parallel to the top surface of the cover. Elevations of the landing areas define a first plane and the second substrate is disposed within a second plane. The first axis and the second axis are angularly aligned to within less than two degrees of rotation. The second plane that is parallel to the first plane to within less than two degrees of tilt. In one or more embodiments, the first substrate belongs to a first MEMS component that includes a mass suspended above the first substrate.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
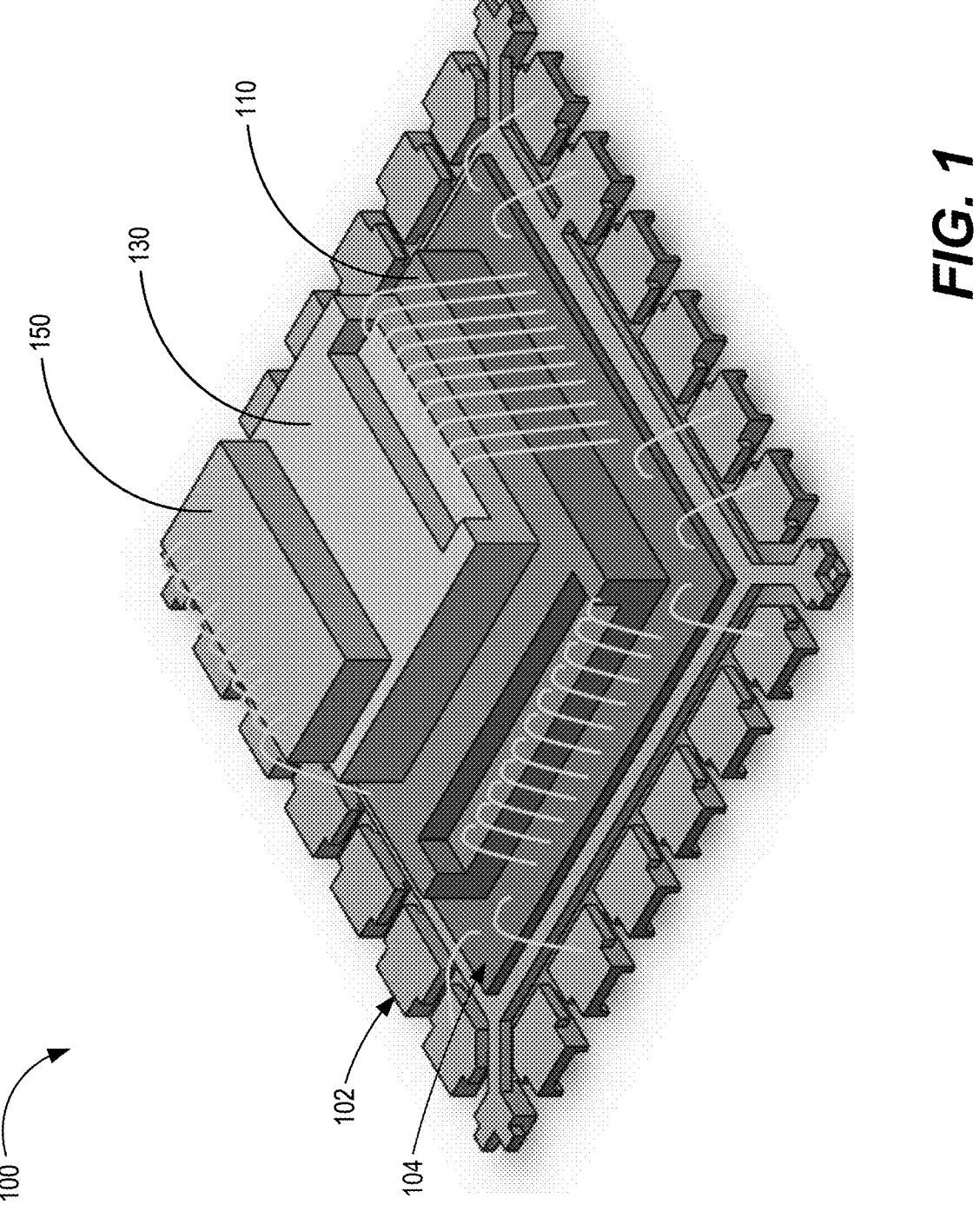
FIG. 1 is a perspective view of an example device in which embodiments disclosed herein may be practiced.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known features may be omitted for clarity.

FIG. 1 shows an example device in which embodiments of the disclosure may be practiced. The device 100 includes a leadframe 102, a carrier substrate 104 and devices 110, 130, 150 in a stacked arrangement. In this example, electrical wire bond connections are made from the devices 110, 130, 150 to the carrier substrate 104 and from the carrier substrate 104 to the leadframe 102. The device 100 may be configured for use as a multiple-axis motion sensor. For instance, the device 110 may be an x-axis motion sensor, the device 130 may be a y-axis motion sensor, and the device 150 may be a z-axis motion sensor. In this example it is desirable that the x, y, and z-axes are all mutually orthogonal (or as close to being mutually orthogonal as possible to ensure accuracy of the device 100. However, misalignment of the devices 110, 130, 150 can occur when they are assembled together to form the device 100. In some previous approaches, alignment accuracy is limited by the accuracy of automated assembly systems. Accordingly, embodiments herein provide devices and methods which include mechanical features that allowed for improved registration of one device relative to another using conventional assembly equipment.

Figure 2:
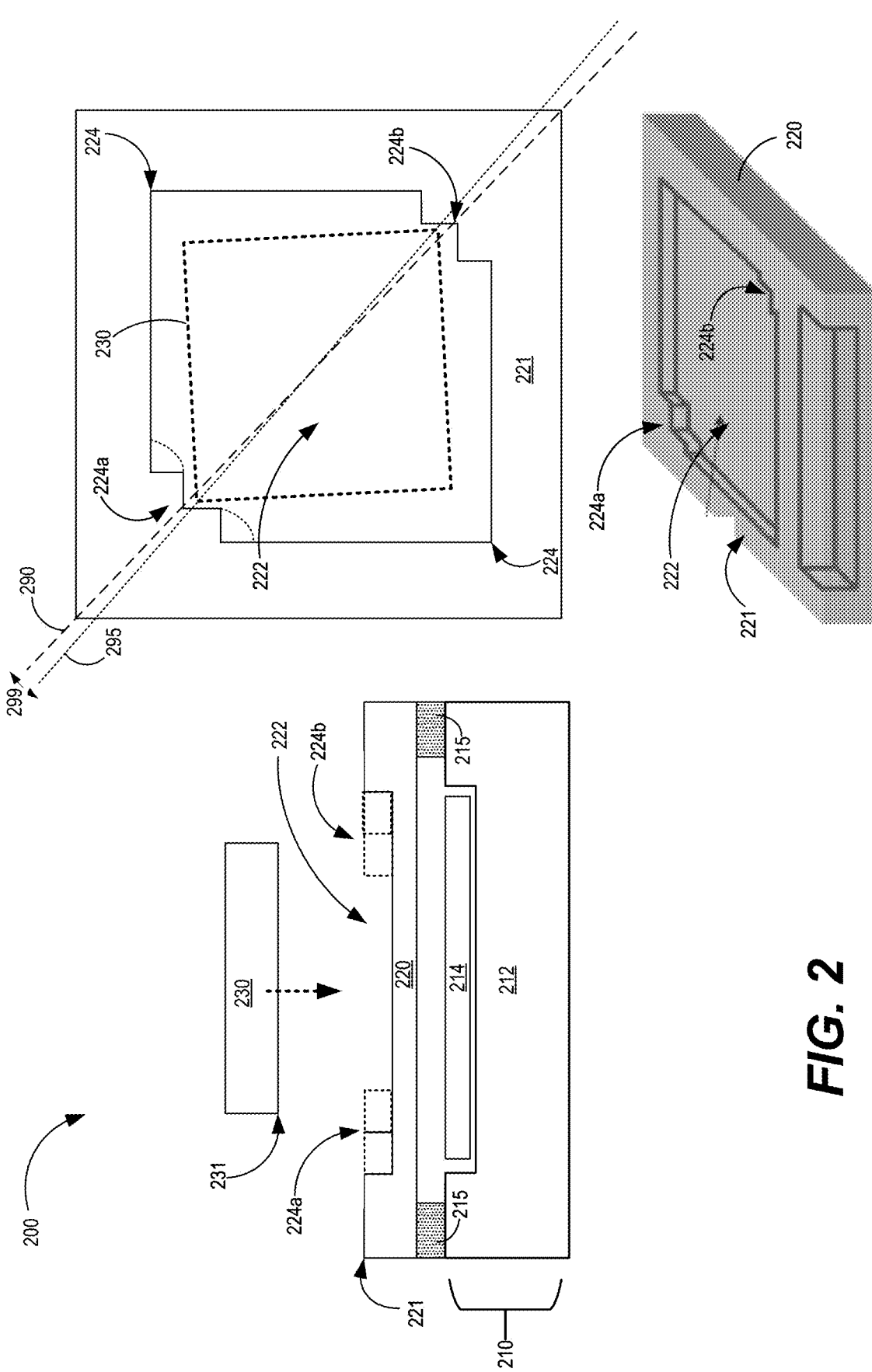
FIG. 2 illustrates elements of an example assembly according to one or more embodiments.

FIG. 2 illustrates elements of an example assembly according to one or more embodiments. The assembly 200 includes a device 210 that is coupled to a die 230. In this non-limiting example, the device 210 is a micro-electrical mechanical systems (MEMS) device such as an accelerometer that includes a proof mass 214 suspended above a substrate 212. A cover 220 is bonded to the substrate 212 via spacers 215 to protect the proof mass 214. The cover 220 has an alignment recess (i.e., the recess 222) that is configured to receive the die 230 and includes features described further below that can be used to control rotational alignment of the die 230 relative to the cover 220 and to the device 210. The cross-sectional view of the assembly 200 corresponds to a line that vertically bisects the plan view of the top surface 221 of the cover 220. The dashed regions within the recess 222 correspond to positions of the protrusions in the wall of the recess 222 that form the notches in the corner regions 224a, 224b.

As can be understood more clearly from the plan view and perspective view of the cover 220, the recess 222 has a larger footprint than the die 230 and has four corner regions 224 along the outside wall of the recess 222. The wall of the recess 222 protrudes toward the center of the recess 222 in two of the corner regions 224 (the corner regions 224a, 224b) which are diagonally opposite each other. Each of the corner regions 224a, 224b has a notch that is sized and positioned such that when the die 230 is approximately centered in the recess 222, the notches surround respective corners of the die 230. As a result, rotation of the die 230 within the recess 222 is constrained as illustrated schematically by the angle 299 between the axis 290 which passes through the apex of each of the notches at the corner regions 224a,b and the axis 295 which passes through corresponding corners of the die 230. The wall of the recess 222 surrounding each notch need not be step-shaped. For instance, the wall of the recess 222 may be rounded as indicated by the dashed lines in the corner region 224a instead, or may have any other suitable shape. In the plan view of FIG. 2 the relative footprint of the die 230 is exaggerated for illustration. It will be understood that any suitable axes can be used to define the angular offset between the orientation of a device (e.g., the die 230) and its desired angular orientation and that the axes 290, 295 of FIG. 2 are used for the purposes of illustration only.

A recess according to one or more embodiments (e.g., a recess 222) herein can be dimensioned to achieve a desired degree of control over the angular orientation of a substrate, die, or other device (e.g., a die 230). For example, it will be understood that when the width of the recess measured diagonally from the apex of one notch to the opposite notch (e.g., from the apex of the notch at the corner region 224a to the apex of the notch at the corner region 224b) is only slightly larger than the diagonal width of die positioned within the recess as shown in FIG. 2, the angular range of motion for that die will be relatively small. Meanwhile, if the recess is enlarged relatively to the die, the angular range of motion of the die will become larger.

The dimensions of a recess relative to a substrate intended to be disposed in that recess can be selected to accommodate the alignment capabilities of any tool(s) or process(es) used to place the substrate in the recess. For example, in one or more embodiments, a recess such as the recess 222 and a die such as the die 230 are jointly configured to control the angular position of the device to within two degrees of rotation, while in some such embodiments, the angular position is controlled to within one degree of rotation and in other such embodiments, the angular position is controlled to within a predetermined limit between one degree and two degrees of rotation, which may also depend on the capabilities of die placement equipment employed by a user. In one or more embodiments, the distance from the apex of one notch to a second notch (e.g., from the apex of the notch at the corner region 224a to the apex of the notch at the corner region 224b) is less than 2% larger than the distance between the corresponding corners of the die when the die is disposed within the recess. It will be understood that the relative dimensions of a recess to a die may be varied based on the absolute size of the die. A recess according to embodiments herein can be dimensioned to accommodate typical device die. For instance, a recess may have a depth in the range as 50-100 μm as one non-limiting example.

Figure 3:
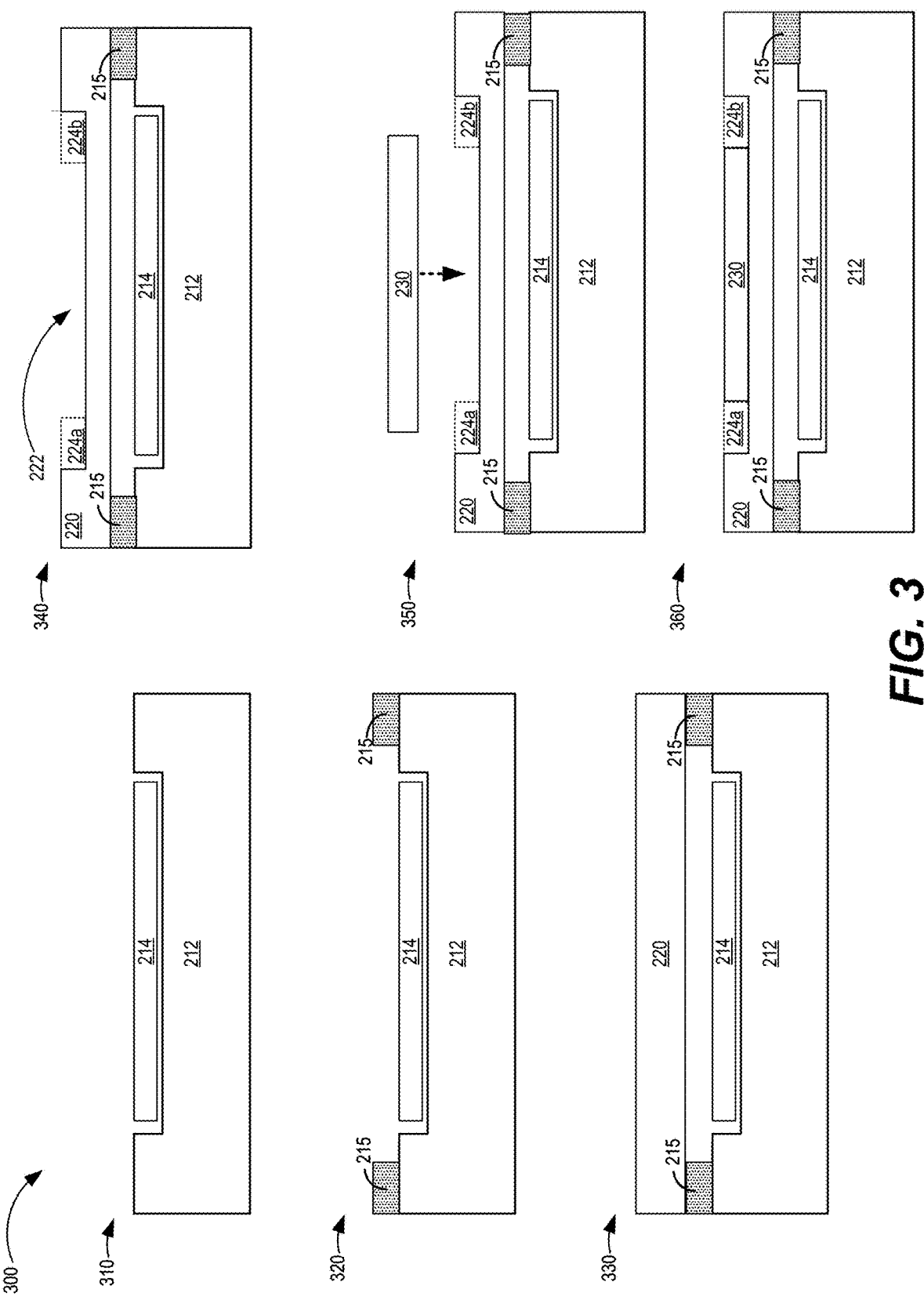
FIG. 3 depicts steps in an example process suitable for forming the assembly of FIG. 2 and similar devices according to one or more embodiments.

FIG. 3 depicts steps in an example process suitable for forming the assembly 200 of FIG. 2 and similar devices. The process 300 includes the steps 310, 320, 330, 340, 350, and 360 which are described below with reference to components of the assembly 200. It will be appreciated that, in one or more embodiments, steps of the process 300 or similar steps may be omitted or performed in any suitable order other than order described herein in connection with FIG. 3.

At step 310, the device 210 (i.e., the substrate 212 with a proof mass 214 suspended above the substrate 212) is received. At step 320, spacers 215 are formed adjacent to and above the proof mass 214 on the substrate 212. The spacers may be any suitable material. For example, in one or more embodiments, the spacers 215 are glass frit, while in one or more other embodiments they are metallic material such as aluminum or germanium which can form an alloy bonding the cover 220 to the substrate 212. In one or more other embodiments, the spaces 215 may be an adhesive or other curable polymer precursor. It will be understood that, in one or more alternative processes, the spacers 215 may be a preexisting feature on the substrate 212 to which the cover 220 is bonded by any suitable method, including but not limited to known wafer bonding methods.

At step 330, the cover 220 is bonded to the substrate 212 via the spacers 215. A cover such as the cover 220 may be formed from any suitable material. In one or more embodiments, the cover 220 is formed from a semiconductor substrate including silicon (Si), silicon-germanium (SiGe), gallium nitride (GaN), gallium arsenide (GaAs), silicon carbide (SiC) or the like. In one or more embodiments, a cover such as the cover 220 is formed from a silicon oxide such as glass or quartz, a silicon nitride, an aluminum oxide, or the like.

At step 340, the recess 222 is formed in the cover 220, including the notches in the corner regions 224a, 224b as shown in FIG. 2. The recess 222 can be formed by any suitable process including, but not limited to, a photolithographic process in which a masking material (e.g., photoresist) is patterned above the cover 220 and the cover 220 is selectively etched using wet chemical etching, plasma etching or any other suitable process to form the recess 222 in regions that are not protected by the masking material. In one or more embodiments, the cover 220 may be patterned directly via a micromachining process such as laser ablation.

At step 350, the die 230 is placed in the recess 222 and coupled to the cover 220 via any suitable method including but not limited to bonding the die 230 to the cover 220 using an adhesive film, curable polymer, solder, or other material (not shown). At step 360, the assembly 200 is fully formed with the die 230 secured to the cover 220 within the recess 222.

In one or more embodiments, a recess such as the recess 222 is patterned in a cover such as the cover 220 before the cover is joined to a substrate such as the substrate 212 (i.e., the step 340 may be performed before the step 330).

Figure 4:
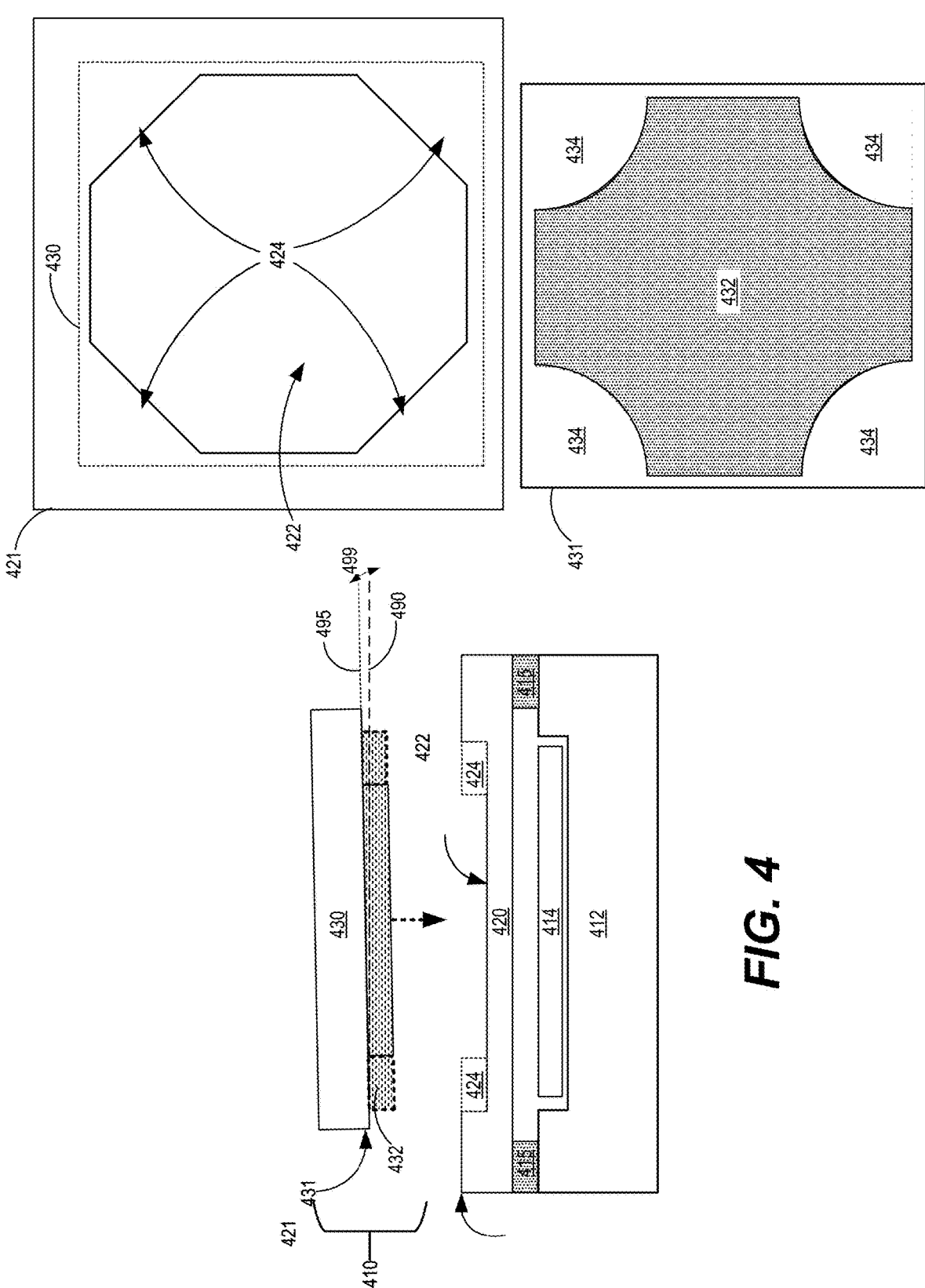
FIG. 4 shows another example assembly according to one or more embodiments.

FIG. 4 shows another example assembly according to one or more embodiments.

Similarly to the assembly 200, the assembly 400 includes a device 410 that includes a substrate 412 and a proof mass 414 suspended above the substrate 412. A cover 420 is coupled to the substrate 412 by spacers 415 (e.g., spacers 215) that are disposed adjacent to and above the proof mass 414. A die 430 is disposed within a recess 422 in the cover 420 and coupled to the cover 420 via a die attachment material 432. The cross-sectional view of the assembly 400 corresponds to a line that vertically bisects the plan view of the top surface 421 of the cover 420. The dashed regions within the recess 422 correspond to positions of the protrusions in the wall of the recess 422 that form the chamfered surfaces at the corner regions 424, as described below. The recess 422 is configured to ensure the bottom surface 431 of the die 430 remains as coplanar with the top surface 421 of cover 420 as possible after it is bonded to the cover 420, which can be understood with reference to the plan views of the cover 420 and the die 430 in FIG. 4.

As shown, in the plan view of the cover 420, one suitable arrangement for the recess 422 is a rectangle with chamfers at the corner regions 424 (i.e., an octagonal recess). It will be understood that the protruding areas of the wall of the recess 422 in the corner regions 424 can have any suitable geometry (e.g., the chamfered portions shown may be rounded instead). The recess 422 has a smaller footprint than the footprint of the die 430 which is indicated by the dashed line surrounding the recess 422. The die 430 has a die attachment material 432 disposed on the bottom of the die 430 which is patterned with a shape that is complementary to the recess 422. The footprint of the die attachment material 432 on the die 430 is also smaller than the footprint of the recess 422. When the die 430 is brought into contact with the cover 420, all or a portion of each corner 434 rests on the top surface 421 of the cover 420 above the recess 422 (i.e., above the corner regions 424). The die attachment material 432 is configured to deform when the die 430 is bonded to the cover 420 using any suitable process. The die attachment material is patterned such that the material can flow or deform laterally to further fill the recess 422 while remaining contained within the recess 422 without displacing the die 430 from resting directly on the cover 420 above the recess. As a result, when the die 430 is placed directly above the recess 422, the bottom surface 431 of the die 430 will be aligned with the top surface of the cover 420 to within the limits of the planarity of the top surface 421 of the cover 420 and the bottom surface 431 of the die 430 (e.g., the rotation 499 between the axis 490 which is parallel to the top surface 421 of the cover and the axis 495 which is parallel to the bottom surface 431 of the die 430 will be less than a predetermined amount).

It will be appreciated that assembly 400 is described for purposes of illustration and that other arrangements are possible. For example, in one or more embodiments, a die attachment material such as the die attachment material 432 can be disposed within a recess such as the recess 422 prior to completion of an assembly such as the assembly 400, rather than on a die such as the die 430.

In one or more embodiments, a die attachment material such as the die attachment material 432 is a die attachment film or other adhesive material (e.g., a silicone adhesive) which can flow or deform under pressure when it contacts a recess of a cover such as the recess 422 of the cover 420 and/or the bottom surface of a die such as the die 430. In one or other more embodiments, such a die attachment material is a solder or sinter which is heated to bond the die to the cover. In one or more other embodiments a die attachment material such as the die attachment material 432 is a polymeric material such as epoxy compound, including, but not limited to a conductive epoxy such as a silver-bearing epoxy.

Figure 5:
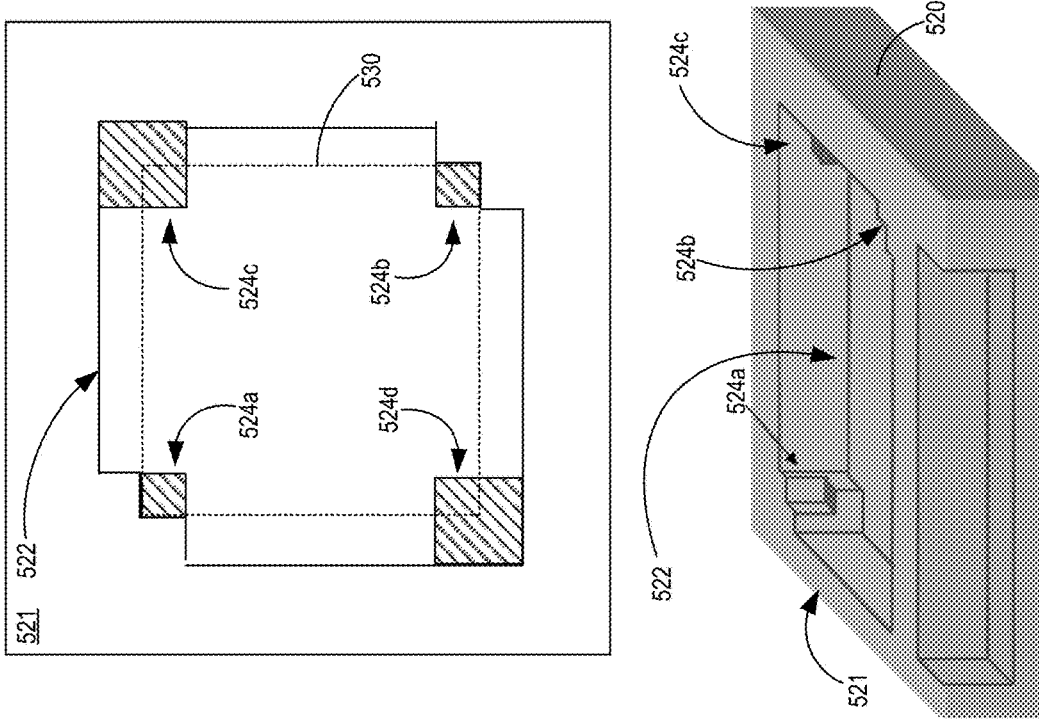
FIG. 5 illustrates elements of another example assembly according to one or more embodiments.
Figure 5:
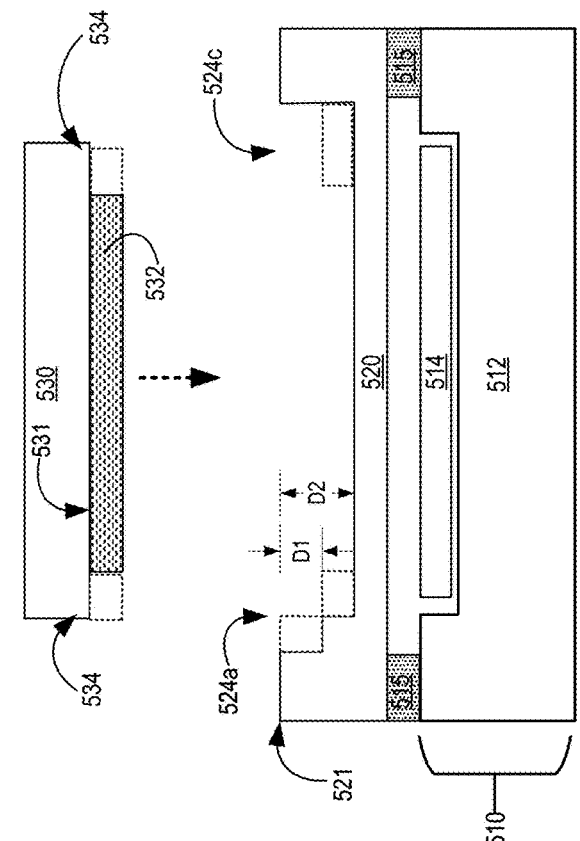

FIG. 5 illustrates elements of an example assembly according to one or more embodiments. The assembly 500 includes a device 510 that is coupled to a die 530. In this non-limiting example, the device 510 is a micro-electrical mechanical systems (MEMS) device such as an accelerometer that includes a proof mass 514 suspended above a substrate 512. A cover 520 is bonded to the substrate 512 (e.g., a substrate 212/412) via spacers 515 (e.g., spacers 215/415) to protect the proof mass 514. The cover 520 has an alignment recess (i.e., the recess 522) that is configured to receive the die 530. The recess 522 includes features described further below that can be used to control both the rotational alignment of the die 530 relative to the cover 520 (and to the device 510) as well as features that ensure the die 530 will be coplanar with the top surface 521 of the cover 520 to within the limits of the planarity of the surface of the cover 520 and bottom surface of the die 530. The cross-sectional view of the assembly 500 corresponds to a line that vertically bisects the plan view of the top surface 521 of the cover 520. The dashed regions within the cross-section of the recess 522 correspond to positions of the protrusions in the wall of the recess 522 that form the notch and landing area in the corner region 524a and the landing area in the corner region 524c.

As visible in the plan view of the top surface 521 of the cover 520, the recess 522 has corner regions 524a, 524b which are diagonally opposite each other and corner regions 524c, 524d opposite each other. All four corners 524 include a landing area that is recessed by a first depth (see the depth D1 in the cross-sectional view of FIG. 5) with respect to the top surface 521 that is less than the depth of the recess 522 outside of the corner regions 524.

The footprints of these areas are hatched in the plan view of FIG. 5. These landing areas function similarly to the corner regions 424 of the recess 422 of FIG. 4 and allow the die 530 to be supported at its corners above the bottom of the recess 522.

In two of the corner regions 524 (the corner regions 524a, 524b), the outer edge of the recess 522 protrudes toward the center of the recess 522. Each of the corner regions 524a, 24b has a notch that is sized and positioned such that when the die 530 is approximately centered in the recess 522, the notches surround respective corners of the die 530. The notches in the corner regions 524a, 524b function analogously to the notches in the corner regions 224a, 224b of FIG. 2. Specifically, when the recess 522 and the die 530 are appropriately dimensioned, the angular orientation of the die 530 can be controlled to within a desired range.

The die 530 can be bonded to the cover 520 similarly to bonding the die 430 in the recess 422. That is, the die attachment material 532 (e.g., the die attachment material 432) is patterned on the bottom surface 531 of the die 530 such that it is absent from the corners of the bottom surface 531 and has a footprint that is smaller than a footprint of the recess 522. The die attachment material 532 is configured such that, when the die 530 is lowered into the recess 522, the die attachment material 532 will be compressed between the bottom surface 531 of the die 530 and the bottom and the recess 522, at which point, the die attachment material 532 will deform or flow beneath the die 530 expanding further into the recess 422, away from the die 530. When the corners 534 of the die 530 are supported at the landing areas (i.e., in the corner regions 524 of the recess 522) and sufficient downward pressure is applied, the die 530 will tend to be "self-leveled" within the recess 522 ensuring that the bottom surface 531 of the die 530 is sufficiently coplanar relative to the top surface 521 of the cover 520 (i.e., the die 530 is not excessively tilted with the respect to the cover 520), while the placement of two of the corners 534 of the die 530 within the notches in the corner regions 524a, 524b will ensure that the die 530 is angularly aligned with the cover 520 (and hence with the device 510).

Figure 6:
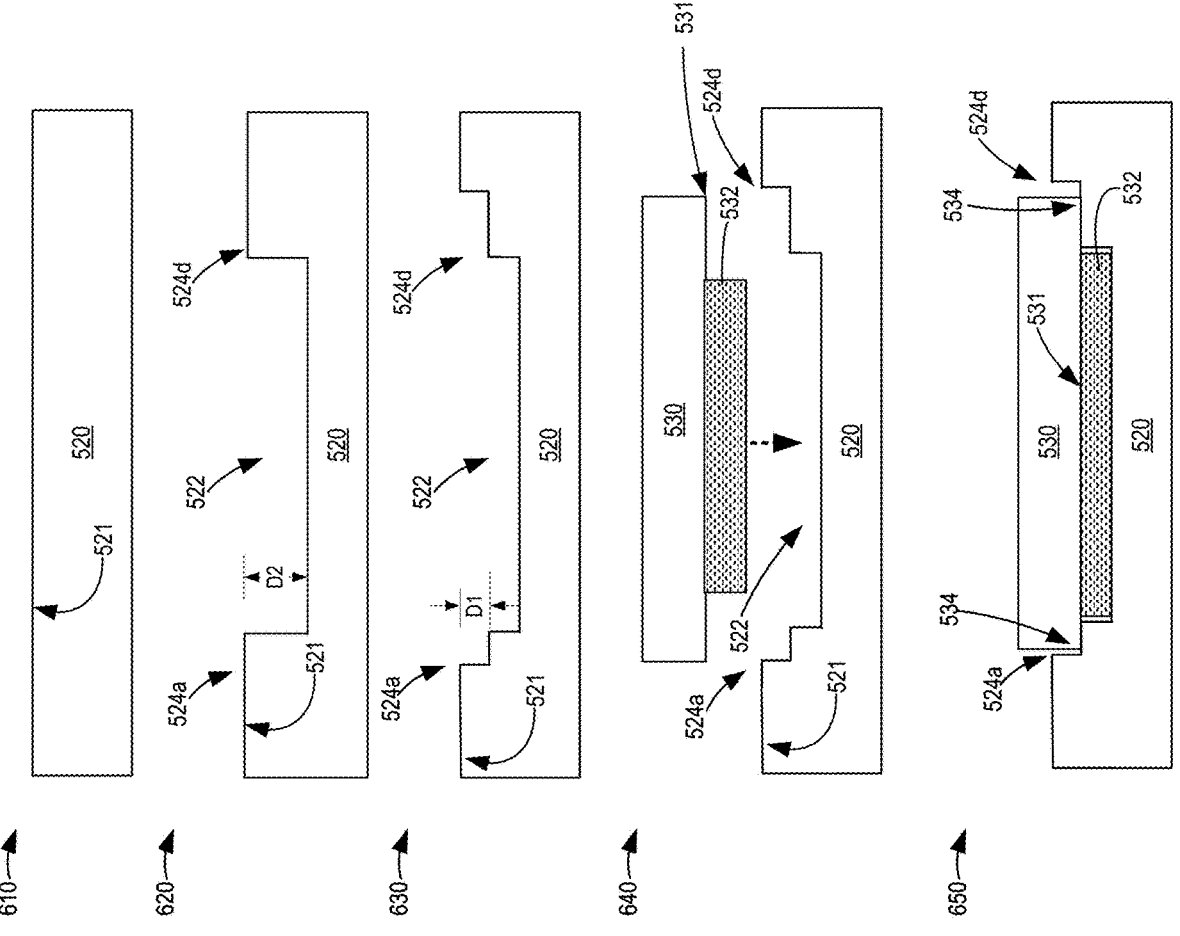
FIG. 6 depicts cross-sectional views at steps in an example process suitable for forming the assembly of FIG. 5 and similar assemblies according to one or more embodiments.

FIG. 6 depicts cross-sectional views at steps in an example process suitable for forming the assembly 500 of FIG. 5 and similar assemblies. The process 600 includes the steps 610, 620, 630, 640 650, which are described below with reference to components of the assembly 500. It will be appreciated that, in one or more embodiments, steps of the process 600 or similar steps may be omitted or performed in any suitable order other than the order described herein in connection with FIG. 6.

At step 610, the cover 520 is received. The cover 520 may be received as a standalone part, or already bonded to the substrate 512 of the device 510. At step 620, the portions of recess 522 outside the landing areas of the corner regions 524 are formed in the cover 520 (i.e., the portions of the recess having the depth D2 shown in FIG. 5). The recess 522 can be formed by any suitable process including, but not limited to, a photolithographic process in which a masking material (e.g., photoresist) is patterned above the cover 520 and the cover 520 is selectively etched (e.g., using wet chemical etching or plasma etching) to form the recess 522 in regions that are not protected by the masking material. In one or more embodiments, a cover such as the cover 520 may be patterned directly via a micromachining process such as laser ablation form a recess such as the recess 522.

At step 630, the cover 520 is further patterned to form the landing areas in the corners 524 of the recess 522 using any suitable process (i.e., the areas of the recess 522 that have the depth D1 as shown in FIG. 5). The formation of the landing areas in the corner regions 524a, 524b also results in formation of the notches in the corner regions 524a, 524b.

At step 640, the die 530 (shown with the die attachment material 532 on the bottom surface 531) is brought into contact with the cover 520 and disposed within the recess 522. Pressure or heat may be applied to cause the die attachment material 532 to deform spread away from the center of the die 530 toward the edges of the recess 522.

Finally, at step 650, the die 530 is disposed in the recess 522 with the corners 534 of the die 530 resting on the landing areas at the corners 524 of the recess 522. The die 530 is bonded to the cover 520 by the die attachment material 532.

It will be understood that, in one or more embodiments, a die attachment material such as the die attachment material 532 (e.g., the die attachment material 432) may be disposed within a recess of a cover such as the recess 522 of the cover 520 prior to bonding of a die to that cover instead of the die attachment material being disposed on the die. It will also be understood that any suitable materials and processes may be used to bond a die to a cover according to embodiments herein. Accordingly, in or more embodiments, a die attachment material such as the die attachment material 532 is a die attachment film or other adhesive material (e.g., a silicone adhesive) which can flow or deform under pressure when it contacts a recess such as the recess 522 and/or contacts the bottom surface of a die such as the die 530. In one or other more embodiments, such a die attachment material is a solder or sinter which is heated to bond the die to the cover. In one or more other embodiments a die attachment material such as the die attachment material 532 is an epoxy compound, including, but not limited to a conductive epoxy such as a silver-bearing epoxy.

Figure 7:
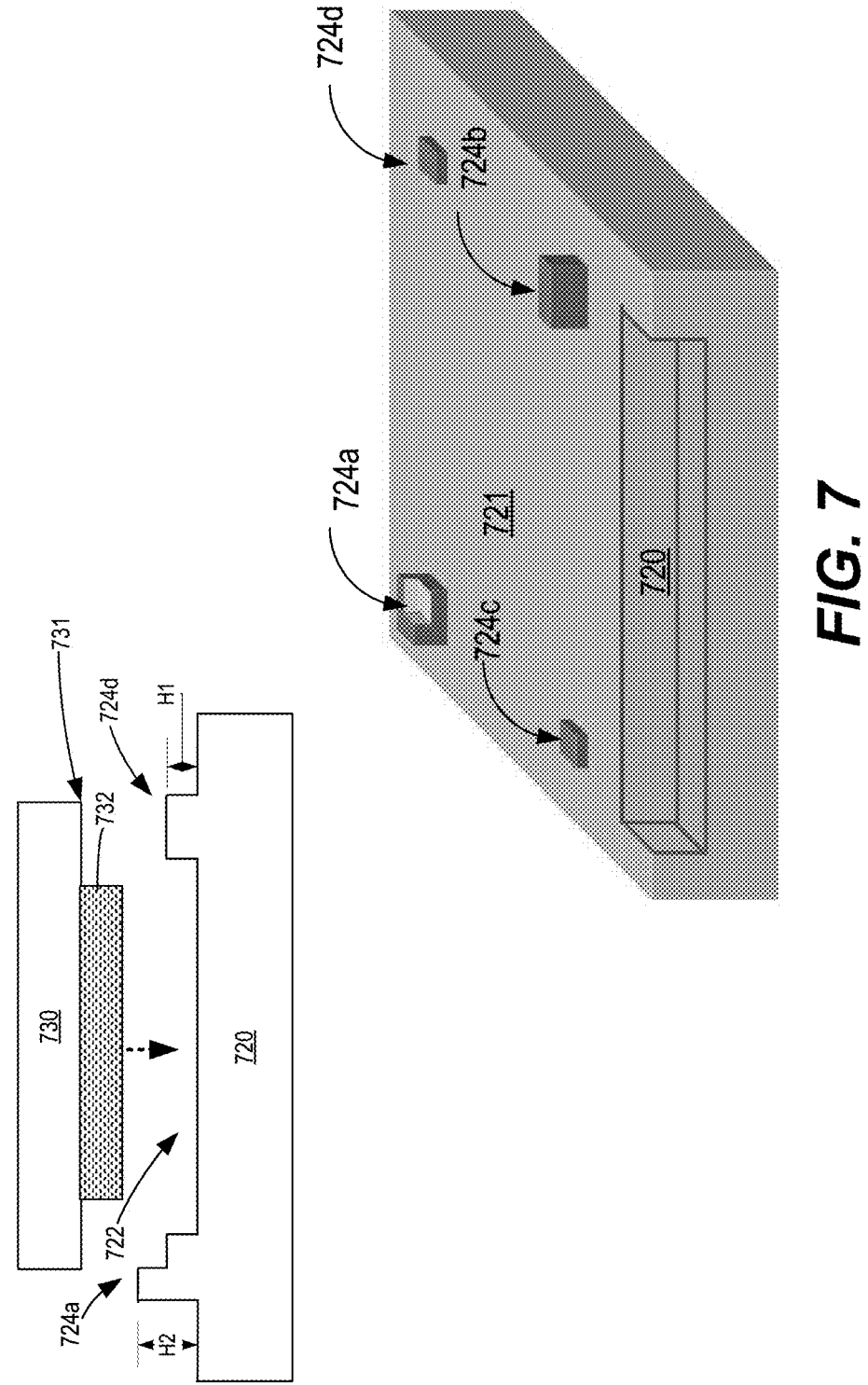
FIG. 7 is perspective view of another cover according to one or more embodiments.

FIG. 7 is cross-sectional view and perspective view of a cover 720 according to one or more embodiments that also enables a die to be bonded to the cover in a manner that allows both the rotational alignment and the tilt of the die to be controlled relative to the orientation of the cover 720. In the example of FIG. 7, the cover 720 is provided with a set of raised features on its top surface 721 that function analogously to the features of the corners 524 of the cover 520. However, the cover 720 does not require a recess such as the recess 522. The features 724a, 724b are positioned diagonally across from each other analogously to the corner regions 524a, 524b of the cover 520. Each of the features 724a, 724b has a landing area that extends to the height H1 indicated in the cross-sectional view surrounded by a notched sidewall that extends above the top surface 721 by the height H2 indicated in the cross-sectional view. The landing areas of the features 724c, 724d also extend to the height H1 and are positioned diagonally across from each other analogously to the corner regions 524c, 524d of the cover 520 and act as additional landing areas for a die such as the die 530.

EXAMPLES

Features of embodiments may be understood by way of one or more of the following examples:

Example 1: A device or method that includes a cover being disposed above a first substrate and coupling the cover to the first substrate. An alignment recess is formed in a top surface of the cover. The alignment recess has a first length and a first width at a center of the alignment recess. The alignment recess has a second length that is less than the first length and a second width that is less than the first width at each of four corner regions of the alignment recess. A second substrate is disposed on the top surface of the cover above the alignment recess. The second substrate has a third length that is greater than the second length and a third width that is greater than the second length. Die attachment material is caused to fill part of the alignment recess such that corners of the second substrate rest on a surface of the cover surrounding the alignment recess and the second substrate is bonded to the cover by the die attachment material within the alignment recess.

Example 2: The device or method of Example 1 where the first substrate includes above a first micro-electromechanical system (MEMS) component that includes a mass suspended above the first substrate Example 3: A device or method as in Example 1 or Example 2 that further includes a volume of the die attachment material placed within the alignment recess that is configured to deform or flow during a bonding process that bonds the second substrate to the cover. The volume of the die attachment material is less than a total volume of the alignment recess.

Example 4: A device or method as in Example 3, where the bonding process is a thermocompression bonding process or a solder reflow process.

Example 5: A device or method as in any of Examples 1-4, that also includes a volume of the die attachment material patterned on a back surface of the second substrate that is configured to deform or flow during a bonding process that bonds the second substrate to the cover. The die attachment material is absent from the back surface of the second substrate at the corners of the second substrate.

Example 6: A device or method as in any of Examples 1-5, further that includes forming the alignment recess before coupling the cover to the first substrate.

Example 7: A device or method as in as in any of Examples 1-5, further that includes forming the alignment recess after coupling the cover to the first substrate.

Example 8: A device or method as in as in any of Examples 1-7 that also includes forming a second alignment recess in a top surface of the second substrate. The second alignment recess has a fourth length and a fourth width at a center of the second alignment recess. The alignment recess has a fifth length that is less than the fourth length and a fifth width that is less than the fourth width at each of four corner regions of the second alignment recess. A third substrate is disposed on the top surface of the second substrate above the second alignment recess, the third substrate has a sixth length that is greater than the fifth length and a sixth width that is greater than the fifth length. Die attachment material is caused to fill part of the second alignment recess such that corners of the third substrate rest on a surface of the second substrate surrounding the alignment recess and the third substrate is bonded to the second substrate by the die attachment material within the second alignment recess.

Example 9: A device or method as in any of Examples 1-7 that also includes a second cover disposed above the second substrate. A second alignment recess is formed in a top surface of the second cover. The second alignment recess has a fourth length and a fourth width at a center of the second alignment recess. the alignment recess has a fifth length that is less than the fourth length and a fifth width that is less than the fourth width at each of four corner regions of the second alignment recess. A third substrate is disposed on the top surface of the second cover above the second alignment recess. The third substrate has a sixth length that is greater than the fifth length and a sixth width that is greater than the fifth length. Die attachment material is caused to fill part of the second alignment recess such that corners of the third substrate rest on the top surface of the second cover surrounding the second alignment recess and the third substrate is bonded to the second cover by the die attachment material within the second alignment recess.

Example 10: A method or device that includes: a cover disposed above a first substrate and coupling the cover to the first substrate. An alignment region is formed on the top surface of the cover. The alignment region includes landing surfaces at four corners of the alignment region that extend to a first height above the top surface of the cover within the alignment region. The alignment region also includes a first raised notch partially surrounding a first landing surface at a first corner of the alignment region and extending above the first landing surface; and a second raised notch partially surrounding a second landing surface at a second corner of the alignment region that is diagonally opposite the first corner and extending above the second landing surface. A second substrate is disposed within the alignment region such that corners of the second substrate rest on corresponding landing areas in the alignment region with a first corner of the second substrate resting within the first raised notch and a second corner of the second substrate resting within the second raised notch. Positions of the first notch and the second notch define a first axis parallel to the top surface of the cover and positions of the first corner and the second corner of the second substrate define a second axis parallel to the top surface of the cover. Elevations of the landing areas define a first plane and the second substrate is disposed within a second plane.

Example 11: A device or method as in Example 10 where the first axis and the second axis are angularly aligned to within one to two degrees of rotation.

Example 12: A device or method as in Example 10 where the first axis and the second axis are angularly aligned to within less than one degrees of rotation; and Example 13: A device or method as in any of Examples 10-12 where the second plane that is parallel to the first plane to within one to two degrees of tilt.

Example 14 A device or method as in any of Examples 10-12 where the second plane is parallel to the first plane to within less than one degree of tilt.

Example 15: A device or method as in any of Examples 10-14 where the first substrate includes a first micro-electromechanical system (MEMS) component that includes a mass suspended above the first substrate.

Example 16: A device or method as in any of Examples 10-15 where the landing surfaces are disposed within a recess formed in the cover.

Example 17: A device or method as in any of Examples 10-16 where the notched features are at least partially disposed within the recess formed in the cover.

Example 18: A device or method as in any of Examples 10-17 that also includes a volume of the die attachment material placed within the alignment region that is configured to deform or flow during a bonding process that bonds the second substrate to the cover. A thickness of the die attachment material after the bonding process is performed corresponds to the first height underneath the second substrate.

Example 19: A device or method as in any of Examples 10-17 that also includes a volume of the die attachment material patterned on a back surface of the second substrate that is configured to deform or flow during a bonding process that bonds the second substrate to the cover. The die attachment material is absent from the back surface of the second substrate at the corners of the second substrate. A thickness of the die attachment material after the bonding process is performed corresponds to the first height underneath the second substrate.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A method comprising:

disposing a cover above a first micro-electromechanical system (MEMS) component comprising a mass suspended above a first substrate and coupling the cover to the first substrate;

forming an alignment recess in a top surface of the cover, wherein the alignment recess has a first length and a first width at a center of the alignment recess; and wherein the alignment recess has a second length that is less than the first length and a second width that is less than the first width at each of four corner regions of the alignment recess;

disposing a second substrate on the top surface of the cover above the alignment recess, the second substrate having a third length that is greater than the second length and having a third width that is greater than the second length; and causing die attachment material to fill part of the alignment recess such that corners of the second substrate rest on a surface of the cover surrounding the alignment recess and the second substrate is bonded to the cover by the die attachment material within the alignment recess.

2. The method of claim 1, further comprising:

placing a volume of the die attachment material within the alignment recess that is configured to deform or flow during a bonding process that bonds the second substrate to the cover;

wherein the volume of the die attachment material is less than a total volume of the alignment recess.

3. The method of claim 2, wherein the bonding process is a thermocompression bonding process or a solder reflow process.

4. The method of claim 1, further comprising:

patterning a volume of the die attachment material on a back surface of the second substrate that is configured to deform or flow during a bonding process that bonds the second substrate to the cover;

wherein the die attachment material is absent from the back surface of the second substrate at the corners of the second substrate.

5. The method of claim 1, further comprising forming the alignment recess before coupling the cover to the first substrate.

6. The method of claim 1, further comprising forming the alignment recess after coupling the cover to the first substrate.

7. The method of claim 1, further comprising:

forming a second alignment recess in a top surface of the second substrate, wherein the second alignment recess has a fourth length and a fourth width at a center of the second alignment recess; and wherein the alignment recess has a fifth length that is less than the fourth length and a fifth width that is less than the fourth width at each of four corner regions of the second alignment recess;

disposing a third substrate on the top surface of the second substrate above the second alignment recess, the second substrate having a sixth length that is greater than the fifth length and having a sixth width that is greater than the fifth length; and causing die attachment material to fill part of the second alignment recess such that corners of the third substrate rest on a surface of the second substrate surrounding the alignment recess and the third substrate is bonded to the second substrate by the die attachment material within the second alignment recess.

8. The method of claim 1, further comprising disposing a second cover above the second substrate;

forming a second alignment recess in a top surface of the second cover, wherein the second alignment recess has a fourth length and a fourth width at a center of the second alignment recess; and wherein the alignment recess has a fifth length that is less than the fourth length and a fifth width that is less than the fourth width at each of four corner regions of the second alignment recess;

disposing a third substrate on the top surface of the second cover above the second alignment recess, the third substrate having a sixth length that is greater than the fifth length and having a sixth width that is greater than the fifth length; and causing die attachment material to fill part of the second alignment recess such that corners of the third substrate rest on the top surface of the second cover surrounding the second alignment recess and the third substrate is bonded to the second cover by the die attachment material within the second alignment recess.

9. A micro-electromechanical system (MEMS) device comprising:

a first MEMS component comprising a mass suspended above a first substrate and coupling the cover to the first substrate;

a cover coupled to the first substrate disposed above the mass of the first MEMS component;

an alignment recess formed at a top surface of the cover, wherein the alignment recess has a first length and a first width at a center of the alignment recess; and wherein the alignment recess has a second length that is less than the first length and a second width that is less than the first width at each of four corner regions of the alignment recess;

a second substrate disposed on the top surface of the cover above the alignment recess, the second substrate having a third length that is greater than the second length and having a third width that is greater than the second length; and wherein the second substrate is bonded to the cover within the recess by die attachment material disposed within the alignment recess such that corners of the second substrate rest on a surface of the cover surrounding the alignment recess and the second substrate is bonded to the cover by the die attachment material within the alignment recess.

10. The device of claim 9, wherein the die attachment material is absent from the back surface of the second substrate at the corners of the second substrate.

11. The device of claim 9, further comprising:

a second alignment recess formed at a top surface of the second substrate, wherein the second alignment recess has a fourth length and a fourth width at a center of the second alignment recess; and wherein the alignment recess has a fifth length that is less than the fourth length and a fifth width that is less than the fourth width at each of four corner regions of the second alignment recess;

a third substrate disposed on the top surface of the second substrate above the second alignment recess, the third substrate having a sixth length that is greater than the fifth length and having a sixth width that is greater than the fifth length; and die attachment material that fills part of the second alignment recess such that corners of the third substrate rest on a surface of the second substrate surrounding the second alignment recess and the third substrate is bonded to the second substrate by die attachment material within the second alignment recess.

12. The device of claim 9, further comprising a second cover disposed above the second substrate and coupled to the second substrate;

a second alignment recess formed in a top surface of the second substrate, wherein the second alignment recess has a fourth length and a fourth width at a center of the second alignment recess; and wherein the alignment recess has a fifth length that is less than the fourth length and a fifth width that is less than the fourth width at each of four corner regions of the second alignment recess;

disposing a third substrate on the top surface of the second substrate above the second alignment recess, the third substrate having a sixth length that is greater than the fifth length and having a sixth width that is greater than the fifth length; and die attachment material that forms part of the second alignment recess such that corners of the third substrate rest on the top surface of the second cover surrounding the second alignment recess and the third substrate is bonded to the second substrate by the die attachment material within the second alignment recess.

13. A method comprising:

disposing a cover above a first micro-electromechanical system (MEMS) component comprising a mass suspended above a first substrate and coupling the cover to the first substrate;

forming an alignment region on the top surface of the cover, the alignment region comprising:

landing surfaces at four corners of the alignment region that extend to a first height above the top surface of the cover within the alignment region;

a first raised notch partially surrounding a first landing surface at a first corner of the alignment region and extending above the first landing surface; and a second raised notch partially surrounding a second landing surface at a second corner of the alignment region that is diagonally opposite the first corner and extending above the second landing surface; and disposing a second substrate within the alignment region such that corners of the second substrate rest on corresponding landing areas in the alignment region with a first corner of the second substrate resting within the first raised notch and a second corner of the second substrate resting within the second raised notch;

wherein positions of the first raised notch and the second raised notch define a first axis parallel to the top surface of the cover and positions of the first corner and the second corner of the second substrate define a second axis parallel to the top surface of the cover;

wherein the first axis and the second axis are angularly aligned to within less than two degrees of rotation; and wherein elevations of the landing areas define a first plane and the second substrate is disposed within a second plane that is parallel to the first plane to within less than two degrees of tilt.

14. The method of claim 13, wherein the landing surfaces are disposed within a recess formed in the cover.

15. The method of claim 14, wherein the notched features are at least partially disposed within the recess formed in the cover.

16. The method of claim 13, further comprising:

placing a volume of the die attachment material within the alignment region that is configured to deform or flow during a bonding process that bonds the second substrate to the cover; and performing the bonding process;

wherein a thickness of the die attachment material after the bonding process is performed corresponds to the first height underneath the second substrate.

17. The method of claim 13, further comprising:

patterning a volume of the die attachment material on a back surface of the second substrate that is configured to deform or flow during a bonding process that bonds the second substrate to the cover, wherein the die attachment material is absent from the back surface of the second substrate at the corners of the second substrate; and performing the bonding process;

wherein a thickness of the die attachment material after the bonding process is performed corresponds to the first height underneath the second substrate.

18. A first micro-electromechanical system (MEMS) device comprising:

a cover disposed above a first MEMS component comprising a mass suspended above a first substrate and coupling the cover to the first substrate;

an alignment region formed on the top surface of the cover, the alignment region comprising:

landing surfaces at four corners of the alignment region that extend to a first height above the top surface of the cover within the alignment region;

a first raised notch partially surrounding a first landing surface at a first corner of the alignment region and extending above the first landing surface; and a second notched feature partially surrounding a second landing surface at a second corner of the alignment region that is diagonally opposite the first corner and extending above the second landing surface; and a second substrate disposing within the alignment region such that corners of the second substrate rest on corresponding landing areas in the alignment region, wherein a first corner of the second substrate rests with the first raised notch and a second corner of the second substrate rests within the second raised notch;

wherein positions of the first notch and the second notch define a first axis parallel to the top surface of the cover and positions of the first corner and the second corner of the second substrate define a second axis parallel to the top surface of the cover;

wherein the first axis and the second axis are angularly aligned to within less than two degrees of rotation; and wherein the elevations of the landing areas define a first plane and the second substrate is disposed within a second plane that is parallel to the first plane to within less than two degrees of tilt.

19. The device of claim 18, wherein the landing surfaces are disposed within a recess formed in the cover.

20. The device of claim 19, wherein the notched features are disposed within the recess formed in the cover.

* * * * *